United States Patent
Sehgal et al.

(10) Patent No.: US 9,349,479 B1
(45) Date of Patent: May 24, 2016

(54) BOUNDARY WORD LINE OPERATION IN NONVOLATILE MEMORY

(71) Applicant: SanDisk Technologies Inc., Plano, TX (US)

(72) Inventors: Rohit Sehgal, Mountain View, CA (US); Niles Yang, Mountain View, CA (US); Abhilash Kashyap, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/546,591

(22) Filed: Nov. 18, 2014

(51) Int. Cl.
*G11C 11/34* (2006.01)
*G11C 16/34* (2006.01)
*G11C 11/56* (2006.01)
*G11C 16/10* (2006.01)
*G11C 16/26* (2006.01)

(52) U.S. Cl.
CPC ........ *G11C 16/3427* (2013.01); *G11C 11/5628* (2013.01); *G11C 11/5642* (2013.01); *G11C 16/10* (2013.01); *G11C 16/26* (2013.01)

(58) Field of Classification Search
USPC ............. 365/185.02, 185.03, 185.09, 185.11, 365/185.12, 185.17, 185.18, 185.24, 365/185.29, 185.33
See application file for complete search history.

(56) References Cited

U.S. PATENT DOCUMENTS

| | | |
|---|---|---|
| 4,139,911 A | 2/1979 | Sciulli et al. |
| 4,218,764 A | 8/1980 | Furuta et al. |
| 4,253,059 A | 2/1981 | Bell et al. |
| 4,460,982 A | 7/1984 | Gee et al. |
| 4,612,630 A | 9/1986 | Rosier |
| 4,694,454 A | 9/1987 | Matsuura |
| 4,703,196 A | 10/1987 | Arakawa |
| 4,703,453 A | 10/1987 | Shinoda et al. |
| 4,733,394 A | 3/1988 | Giebel |
| 4,763,305 A | 8/1988 | Kuo |
| 4,779,272 A | 10/1988 | Kohda et al. |
| 4,799,195 A | 1/1989 | Iwahashi et al. |
| 4,809,231 A | 2/1989 | Shannon et al. |
| 4,827,450 A | 5/1989 | Kowalski |
| 4,937,787 A | 6/1990 | Kobatake |
| 4,962,322 A | 10/1990 | Chapman |
| 4,964,079 A | 10/1990 | Devin |
| 4,975,883 A | 12/1990 | Baker et al. |
| 4,980,859 A | 12/1990 | Guterman et al. |
| 5,043,940 A | 8/1991 | Harari |

(Continued)

FOREIGN PATENT DOCUMENTS

| | | |
|---|---|---|
| EP | 97460009.0 | 2/1997 |
| EP | 0791933 | 8/1997 |

(Continued)

OTHER PUBLICATIONS

Lee et al., "Error Correction Technique for Multivalued MOS Memory," *Electronic Letters*, vol. 27, No. 15, Jul. 18, 1991, pp. 1321-1323.

(Continued)

*Primary Examiner* — Trong Phan
(74) *Attorney, Agent, or Firm* — Davis Wright Tremaine LLP

(57) ABSTRACT

One or more word lines in a Multi Level Cell (MLC) block are identified as being at high risk of read disturb errors and data is selectively copied from such high risk word lines to a location outside the MLC block where the copy is maintained. Subsequent read requests for the data may be directed to the copy of the data outside the MLC block.

23 Claims, 16 Drawing Sheets

(56) References Cited

U.S. PATENT DOCUMENTS

| | | | |
|---|---|---|---|
| 5,052,002 A | 9/1991 | Tanagawa | |
| 5,065,364 A | 11/1991 | Atwood et al. | |
| 5,070,032 A | 12/1991 | Yuan et al. | |
| 5,095,344 A | 3/1992 | Harari | |
| 5,119,330 A | 6/1992 | Tanagawa | |
| 5,122,985 A | 6/1992 | Santin | |
| 5,132,928 A | 7/1992 | Hayashikoshi et al. | |
| 5,132,935 A | 7/1992 | Ashmore, Jr. | |
| 5,151,906 A | 9/1992 | Sawada | |
| 5,157,629 A | 10/1992 | Sato et al. | |
| 5,172,338 A | 12/1992 | Mehrotra et al. | |
| 5,172,339 A | 12/1992 | Noguchi et al. | |
| 5,200,922 A | 4/1993 | Rao | |
| 5,200,959 A | 4/1993 | Gross et al. | |
| 5,239,505 A | 8/1993 | Fazio et al. | |
| 5,262,984 A | 11/1993 | Noguchi et al. | |
| 5,263,032 A | 11/1993 | Porter et al. | |
| 5,270,551 A | 12/1993 | Kamimura et al. | |
| 5,270,979 A | 12/1993 | Harari et al. | |
| 5,278,794 A | 1/1994 | Tanaka et al. | |
| 5,313,421 A | 5/1994 | Guterman et al. | |
| 5,313,427 A | 5/1994 | Schreck et al. | |
| 5,315,541 A | 5/1994 | Harari et al. | |
| 5,321,655 A | 6/1994 | Iwahashi et al. | |
| 5,327,383 A | 7/1994 | Merchant et al. | |
| 5,335,198 A | 8/1994 | Van Buskirk et al. | |
| 5,341,334 A | 8/1994 | Maruyama | |
| 5,343,063 A | 8/1994 | Yuan et al. | |
| 5,347,489 A | 9/1994 | Merchant et al. | |
| 5,365,486 A | 11/1994 | Schreck | |
| 5,377,147 A | 12/1994 | Merchant et al. | |
| 5,394,359 A | 2/1995 | Kowalski | |
| 5,404,485 A | 4/1995 | Ban | |
| 5,450,363 A | 9/1995 | Christopherson et al. | |
| 5,465,236 A | 11/1995 | Naruke | |
| 5,475,693 A | 12/1995 | Christopherson et al. | |
| 5,504,760 A | 4/1996 | Harari et al. | |
| 5,523,972 A | 6/1996 | Rashid et al. | |
| 5,530,705 A | 6/1996 | Malone, Sr. | |
| 5,532,962 A | 7/1996 | Auclair et al. | |
| 5,570,315 A | 10/1996 | Tanaka et al. | |
| 5,583,812 A | 12/1996 | Harari | |
| 5,621,682 A | 4/1997 | Tanzawa et al. | |
| 5,648,934 A | 7/1997 | O'Toole | |
| 5,652,720 A | 7/1997 | Aulas et al. | |
| 5,657,332 A | 8/1997 | Auclair et al. | |
| 5,661,053 A | 8/1997 | Yuan | |
| 5,675,537 A | 10/1997 | Bill et al. | |
| 5,689,465 A | 11/1997 | Sukegawa et al. | |
| 5,699,297 A | 12/1997 | Yamazaki et al. | |
| 5,703,506 A | 12/1997 | Shook et al. | |
| 5,712,815 A | 1/1998 | Bill et al. | |
| 5,715,193 A | 2/1998 | Norman | |
| 5,717,632 A | 2/1998 | Richart et al. | |
| 5,751,639 A | 5/1998 | Ohsawa | |
| 5,761,125 A | 6/1998 | Himeno | |
| 5,774,397 A | 6/1998 | Endoh et al. | |
| 5,798,968 A | 8/1998 | Lee et al. | |
| 5,835,413 A | 11/1998 | Hurter et al. | |
| 5,889,698 A | 3/1999 | Miwa et al. | |
| 5,890,192 A | 3/1999 | Lee et al. | |
| 5,905,673 A | 5/1999 | Khan | |
| 5,909,449 A | 6/1999 | So et al. | |
| 5,930,167 A | 7/1999 | Lee et al. | |
| 5,937,425 A | 8/1999 | Ban | |
| 5,963,473 A | 10/1999 | Norman | |
| 6,046,935 A | 4/2000 | Takeuchi et al. | |
| 6,145,051 A | 11/2000 | Estakhri et al. | |
| 6,151,246 A | 11/2000 | So et al. | |
| 6,199,139 B1 | 3/2001 | Katayama et al. | |
| 6,215,697 B1 | 4/2001 | Lu et al. | |
| 6,222,762 B1 | 4/2001 | Guterman et al. | |
| 6,222,768 B1 | 4/2001 | Hollmer et al. | |
| 6,339,546 B1 | 1/2002 | Katayama et al. | |
| 6,345,001 B1 | 2/2002 | Mokhlesi | |
| 6,415,352 B1 | 7/2002 | Asami et al. | |
| 6,426,893 B1 | 7/2002 | Conley et al. | |
| 6,456,528 B1 | 9/2002 | Chen | |
| 6,522,580 B2 | 2/2003 | Chen et al. | |
| 6,560,152 B1 | 5/2003 | Cernea | |
| 6,567,307 B1 | 5/2003 | Estakhri | |
| 6,678,785 B2 | 1/2004 | Lasser | |
| 6,728,134 B2 | 4/2004 | Ooishi | |
| 6,760,255 B2 | 7/2004 | Conley et al. | |
| 6,763,424 B2 | 7/2004 | Conley | |
| 6,772,274 B1 | 8/2004 | Estakhri | |
| 6,807,101 B2 | 10/2004 | Ooishi et al. | |
| 6,839,281 B2 | 1/2005 | Chen et al. | |
| 6,912,160 B2 | 6/2005 | Yamada | |
| 6,925,007 B2 | 8/2005 | Harari et al. | |
| 6,963,505 B2 | 11/2005 | Cohen | |
| 7,012,835 B2 | 3/2006 | Gonzalez et al. | |
| 7,076,598 B2 | 7/2006 | Wang | |
| 7,224,607 B2 | 5/2007 | Gonzalez et al. | |
| 7,224,611 B2 | 5/2007 | Yamamoto et al. | |
| 7,242,618 B2 | 7/2007 | Shappir et al. | |
| 7,254,071 B2 | 8/2007 | Tu et al. | |
| 7,257,025 B2 | 8/2007 | Maayan et al. | |
| 7,286,412 B1 | 10/2007 | Chen | |
| 7,330,376 B1 | 2/2008 | Chen et al. | |
| 7,450,425 B2 | 11/2008 | Aritome | |
| 7,489,549 B2 | 2/2009 | Mokhlesi | |
| 7,518,919 B2 | 4/2009 | Gonzalez et al. | |
| 7,613,043 B2 | 11/2009 | Cornwell et al. | |
| 7,630,254 B2 | 12/2009 | Lutze | |
| 7,631,245 B2 | 12/2009 | Lasser | |
| 7,716,538 B2 | 5/2010 | Gonzalez et al. | |
| 7,835,209 B2 | 11/2010 | Park et al. | |
| 7,843,727 B2 | 11/2010 | Cho et al. | |
| 7,941,592 B2 * | 5/2011 | Bonella | G11C 11/5628 365/185.03 |
| 8,014,201 B2 | 9/2011 | Park | |
| 8,259,506 B1 | 9/2012 | Sommer et al. | |
| 8,374,026 B2 * | 2/2013 | Sharon | G11C 16/349 365/185.02 |
| 8,649,215 B2 * | 2/2014 | Franca-Neto | G11C 16/3495 365/185.02 |
| 8,942,028 B1 * | 1/2015 | Hu | G11C 13/0069 365/185.03 |
| 8,964,463 B2 * | 2/2015 | Ajika | G11C 16/3431 365/185.02 |
| 9,007,825 B2 * | 4/2015 | Camp | G11C 16/3418 365/185.02 |
| 2002/0048202 A1 | 4/2002 | Higuchi | |
| 2003/0086293 A1 | 5/2003 | Gongwer et al. | |
| 2003/0109093 A1 | 6/2003 | Harari et al. | |
| 2005/0073884 A1 | 4/2005 | Gonzalez et al. | |
| 2005/0231999 A1 | 10/2005 | Moriyama | |
| 2006/0039196 A1 | 2/2006 | Gorobets et al. | |
| 2006/0062048 A1 | 3/2006 | Gonzalez et al. | |
| 2006/0233023 A1 | 10/2006 | Lin et al. | |
| 2007/0174740 A1 | 7/2007 | Kanno | |
| 2007/0211532 A1 | 9/2007 | Gonzalez et al. | |
| 2007/0279989 A1 | 12/2007 | Aritome | |
| 2008/0071511 A1 | 3/2008 | Lin | |
| 2008/0123420 A1 | 5/2008 | Brandman et al. | |
| 2008/0158968 A1 | 7/2008 | Moogat et al. | |
| 2008/0158969 A1 | 7/2008 | Moogat et al. | |
| 2009/0003058 A1 | 1/2009 | Kang | |
| 2009/0187785 A1 | 7/2009 | Gonzalez et al. | |
| 2014/0215128 A1 | 7/2014 | Chin et al. | |
| 2014/0247663 A1 | 9/2014 | Yuan et al. | |

FOREIGN PATENT DOCUMENTS

| | | |
|---|---|---|
| GB | 2289779 | 11/1995 |
| JP | 8-077785 | 3/1996 |
| JP | 8-147988 | 6/1996 |
| JP | 8-279295 | 10/1996 |
| JP | 8-297987 | 11/1996 |
| JP | 09-128165 | 5/1997 |
| JP | 9-306182 | 11/1997 |
| JP | 2000-187992 | 7/2000 |
| JP | 2002-318729 | 10/2002 |

(56) References Cited

FOREIGN PATENT DOCUMENTS

| | | |
|---|---|---|
| JP | 2003-058432 | 2/2003 |
| WO | WO 9012400 | 10/1999 |
| WO | WO 01/08015 | 2/2001 |
| WO | WO 01/22232 | 3/2001 |
| WO | WO 02/058074 | 7/2002 |
| WO | WO2005/036401 | 4/2005 |
| WO | WO2005/041107 | 5/2005 |
| WO | WO 2011/024015 | 3/2011 |

OTHER PUBLICATIONS

U.S. Appl. No. 14/526,870 filed Oct. 29, 2014 entitled Read Scrub with Adaptive Counter Management, 49 pages.

* cited by examiner

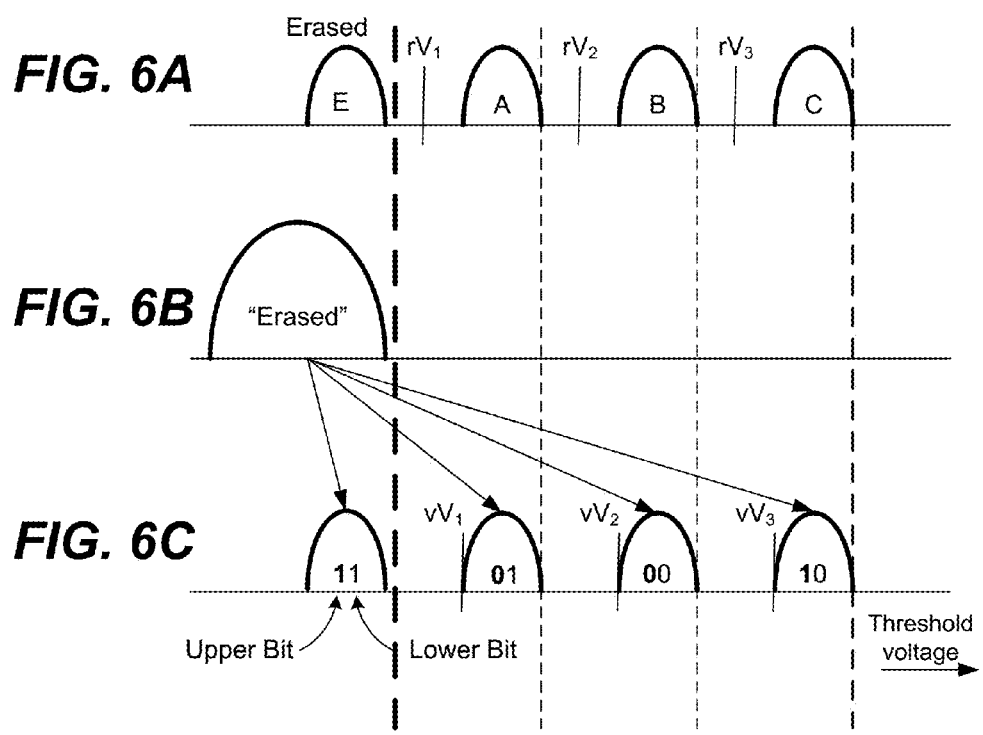

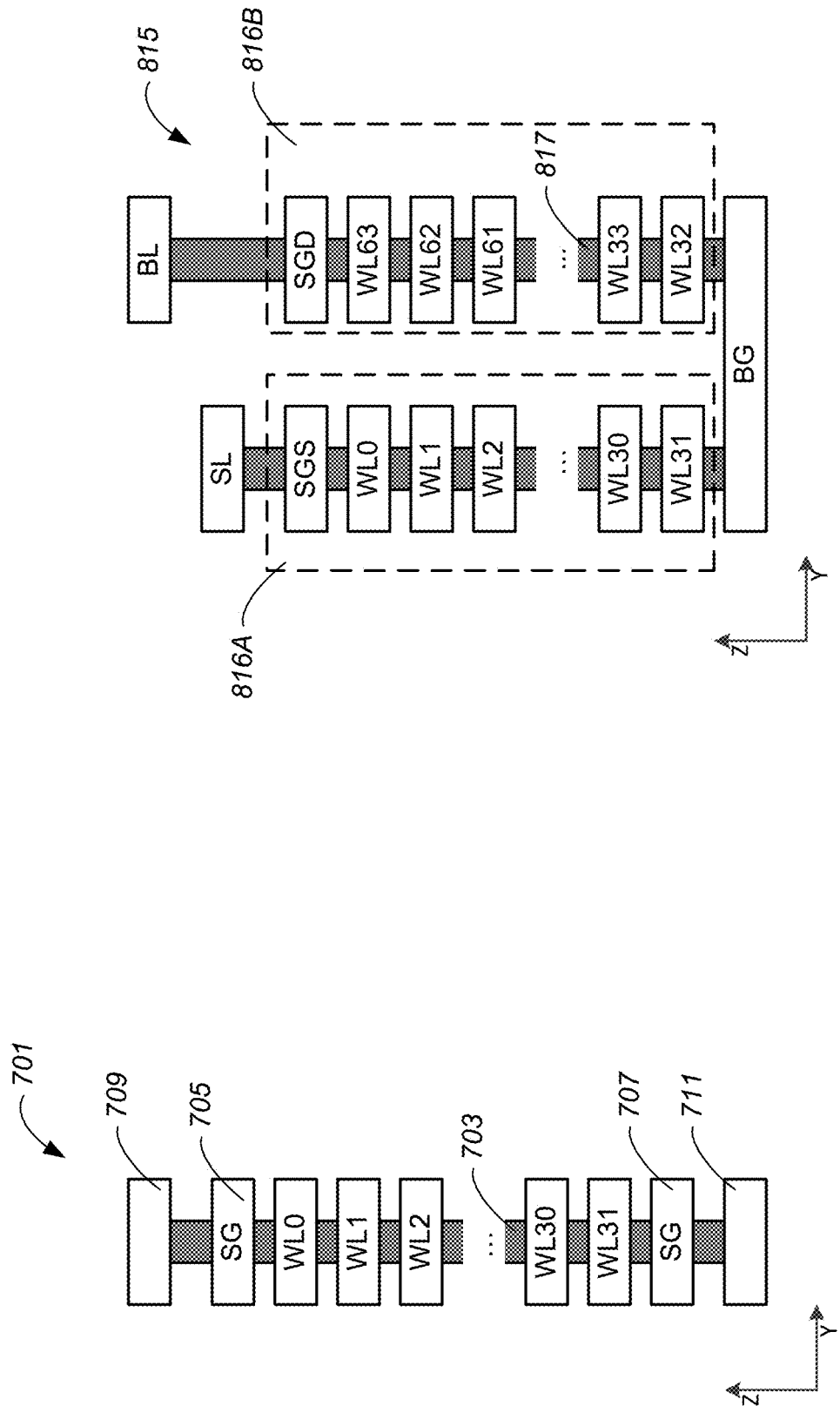

| WL | LP | UP |
|---|---|---|
| 0 | 0 | 2 |
| 1 | 1 | 4 |
| 2 | 3 | 6 |
| 3 | 5 | 8 |
| 4 | 7 | |
| 5 | | |
| 6 | | |
| ... | ... | ... |

*FIG. 11A*

| WL | LP | UP |
|---|---|---|
| 0 | 0 | 2 |
| 1 | 1 | 4 |
| 2 | 3 | 6 |
| 3 | 5 | 8 |
| 4 | 7 | |
| 5 | 9 | |
| 6 | | |
| ... | ... | ... |

*FIG. 11B*

| WL | LP | UP |
|---|---|---|
| 0 | 0 | 2 |
| 1 | 1 | 4 |
| 2 | 3 | 6 |
| 3 | 5 | 8 |
| 4 | 7 | 10 |
| 5 | 9 | |
| 6 | | |
| ... | ... | ... |

*FIG. 11C*

| WL | LP | UP |
|---|---|---|
| 0 | 0 | 1 |
| 1 | 2 | 3 |
| 2 | 4 | 5 |
| 3 | 6 | 7 |
| 4 | 8 | |
| 5 | | |
| ⋮ | ⋮ | ⋮ |

*FIG. 12A*

| WL | LP | UP |
|---|---|---|
| 0 | 0 | 1 |
| 1 | 2 | 3 |
| 2 | 4 | 5 |
| 3 | 6 | 7 |
| 4 | 8 | 9 |
| 5 | | |
| ⋮ | ⋮ | ⋮ |

*FIG. 12B*

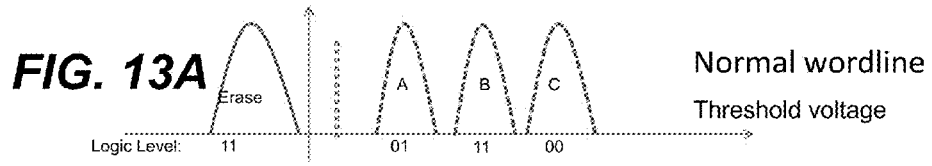
FIG. 13A  Normal wordline Threshold voltage
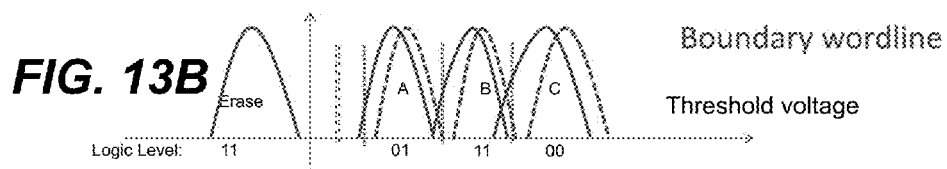
FIG. 13B  Boundary wordline Threshold voltage
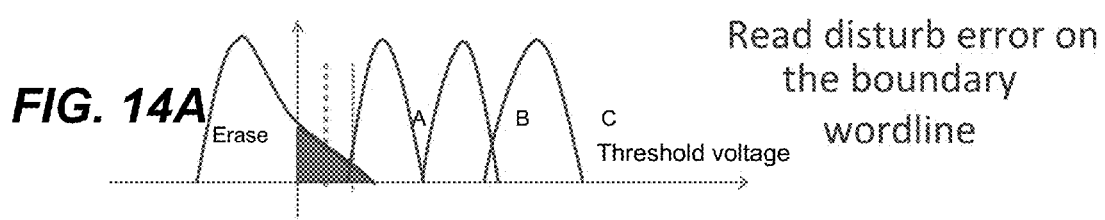
FIG. 14A  Read disturb error on the boundary wordline
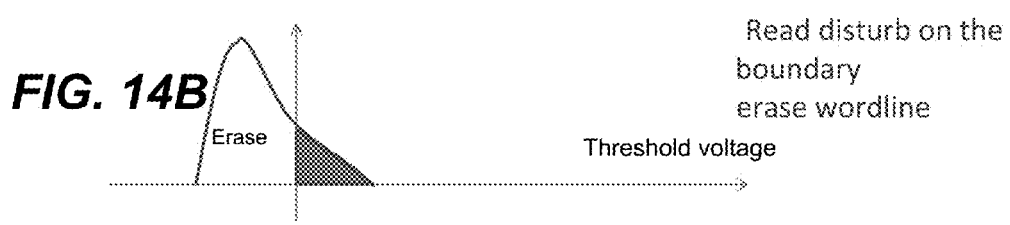
FIG. 14B  Read disturb on the boundary erase wordline

| Index | Data: Logical address | MLC WL address: physically programmed at the boundary | SLC WL address: Physical | Flag: MLC to SLC copy valid |
|---|---|---|---|---|
| \multicolumn{5}{c}{MLC to SLC copy for reducing read disturb} | | | | |
| 0 | | | | |
| 1 | | | | |
| 2 | | | | |
| 3 | | | | |
| 4 | | | | |
| 5 | | | | |
| 6 | | | | |
| 7 | | | | |
| ... | | | | |

*FIG. 17*

BOUNDARY WORD LINE OPERATION IN NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

In some cases, errors occur in data when the data is read out after being stored in a nonvolatile memory. Small numbers of errors can generally be corrected by Error Correction Code (ECC). Large numbers of errors may be uncorrectable by ECC (UECC). Even when errors are correctable, such correction may require significant resources and may take significant time.

SUMMARY

In some memory systems, stored data may become disturbed by read operations so that the stored data develops a high error rate. Data in certain locations may be particularly susceptible to such read disturb errors. Where a word line is in close proximity to the boundary between written and unwritten word lines in an open block (e.g. last fully written MLC word line in a partially written MLC block) data may be particularly susceptible to read disturbs. A counter may maintain a count of the number of read operations affecting such a word line and the data may be copied to another location if the count exceeds a threshold. Such data may be copied from an MLC block to an SLC block so that subsequent reads are faster and the risk of read disturbance is low. Data stored in a word line at a physical edge of a block may also be susceptible to read disturb errors. Accordingly, such data may be copied to another location (e.g. from MLC to SLC) either immediately or when a certain read count is reached.

An example of a method of operating a nonvolatile memory includes: identifying one or more high risk word lines in a Multi Level Cell (MLC) block that contain data that is at high risk of read disturb errors; selectively copying the data from the one or more high risk word lines to a location outside the MLC block; maintaining a copy of the data outside the MLC block; and subsequently directing read requests for the data to the copy of the data outside the MLC block.

The location may be outside the MLC block in a Single Level Cell (SLC) block. Identifying one or more high risk word lines may be based on proximity to a boundary between written and unwritten word lines. Identifying one or more high risk word lines may be further based on counting a number of read operations performed on an individual written word line in close proximity to the boundary. The individual word line may be identified as a high risk word line in response to determining that the number of read operations directed to the individual written word line exceeds a threshold number. Identifying one or more high risk word lines may be based on physical locations of word lines within a block. A word line located at a physical edge of the MLC block may be identified as a high risk word line. The MLC block may be written in a predetermined word line order and the word line at the physical end may be the last written word line in the predetermined word line order. The nonvolatile memory may be a three-dimensional nonvolatile memory that is monolithically formed in one or more physical levels of arrays of memory cells having an active area disposed above a silicon substrate and wherein the one or more high risk word lines are in a highest or lowest physical level.

An example of a nonvolatile memory system includes: a plurality of Multi Level Cell (MLC) blocks that store more than one bit per cell; an identifying circuit that is configured to identify one or more high risk word lines in an individual MLC block that contains data that is at high risk of read disturb errors; a copying circuit that is configured to selectively copy the data from the one or more high risk word lines to a location outside the individual MLC block; and a read circuit that is configured to read the data from the location outside the individual MLC block.

The memory system may also include a plurality of Single Level Cell (SLC) blocks that store only one bit per cell, and the location may be in an SLC block. The identifying circuit may be configured to identify a boundary between written and unwritten word lines. A read count circuit may count the number of read operations performed on an individual written word line adjacent to the boundary between written and unwritten word lines. A comparison circuit may be in communication with the read count circuit, the comparison circuit configured to compare the number of read operations performed with a threshold number and to designate the individual written word line as a high risk word line if the number of read operations performed exceeds the threshold number. The identifying circuit may be configured to identify the one or more high risk word lines from their physical location at an end of the block. The MLC blocks may be formed in a three dimensional memory that is monolithically formed in one or more physical levels of arrays of memory cells having an active area disposed above a silicon substrate, the one or more high risk word lines located in a highest or lowest physical level.

An example of a method of operating a nonvolatile memory includes: writing Multi Level Cell (MLC) data in an MLC block in a plurality of word lines of a block, leaving additional word lines unwritten; subsequently maintaining a count of read operations performed on a last fully written word line of the block; comparing the count with a threshold number; in response to determining that the count exceeds the threshold number, copying the data from the last fully written word line to a Single Level Cell (SLC) block; maintaining a copy of the data in the SLC block; and subsequently directing read requests for the data to the copy of the data in the SLC block.

A partially written word line with only lower page data may be located between the last fully written word line and the additional word lines that are unwritten. The nonvolatile memory may be a three dimensional nonvolatile memory that is monolithically formed in one or more physical levels of arrays of memory cells having an active area disposed above a silicon substrate. The memory system may maintain a number of open MLC blocks that are open for writing new data and individual counts may be maintained of read operations performed on last fully written word lines of each open MLC block. The method may also include: subsequently copying the MLC data from the MLC block to another MLC block and designating the copy of the data in the SLC block as obsolete. Prior to copying the MLC data from the MLC block to another block, additional MLC data may be written in the MLC block. The writing of the additional MLC data in the MLC block may substantially fill the MLC block.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIGS. 11A-C show an example of word line programming order.

FIGS. 12A-B show another example of word line programming order.

FIGS. 13A-B show threshold voltage distributions for different word lines.

FIGS. 14A-B show examples of how read disturb may affect word lines.

FIG. 17 illustrates a table for redirecting read requests for copied data.

DETAILED DESCRIPTION

Memory System

Figure 1:
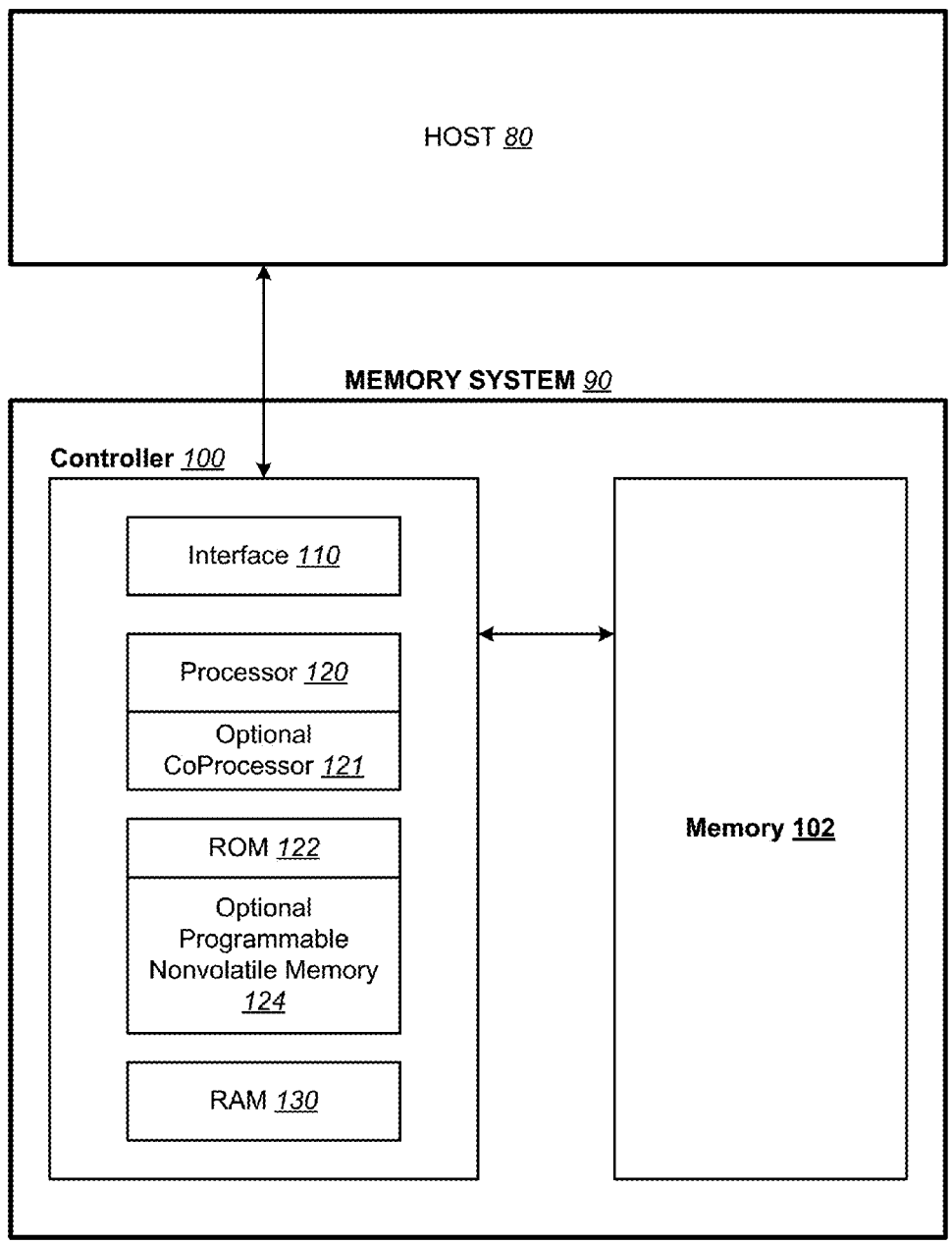
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
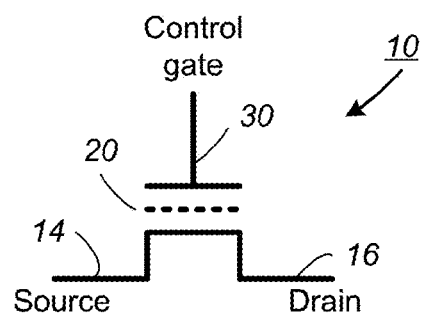
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
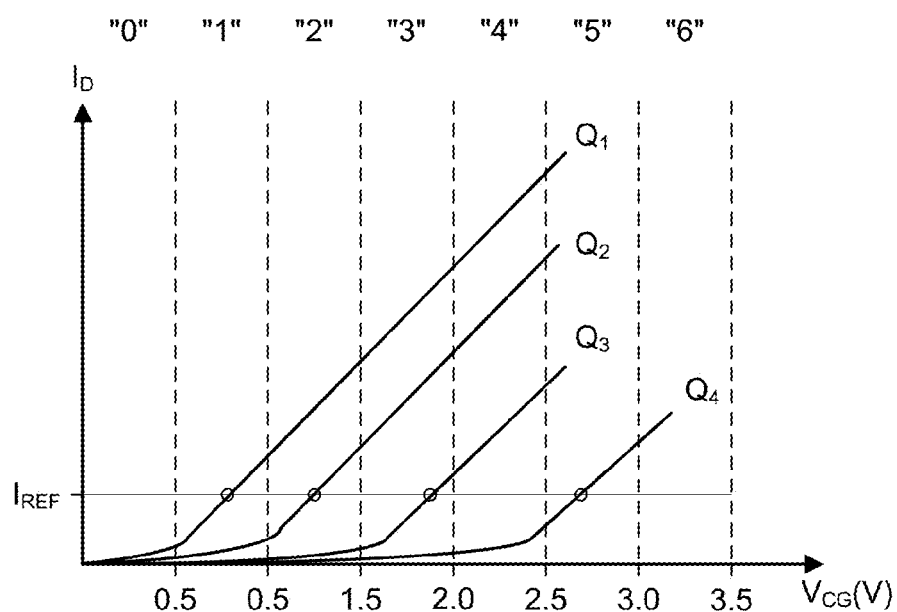
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
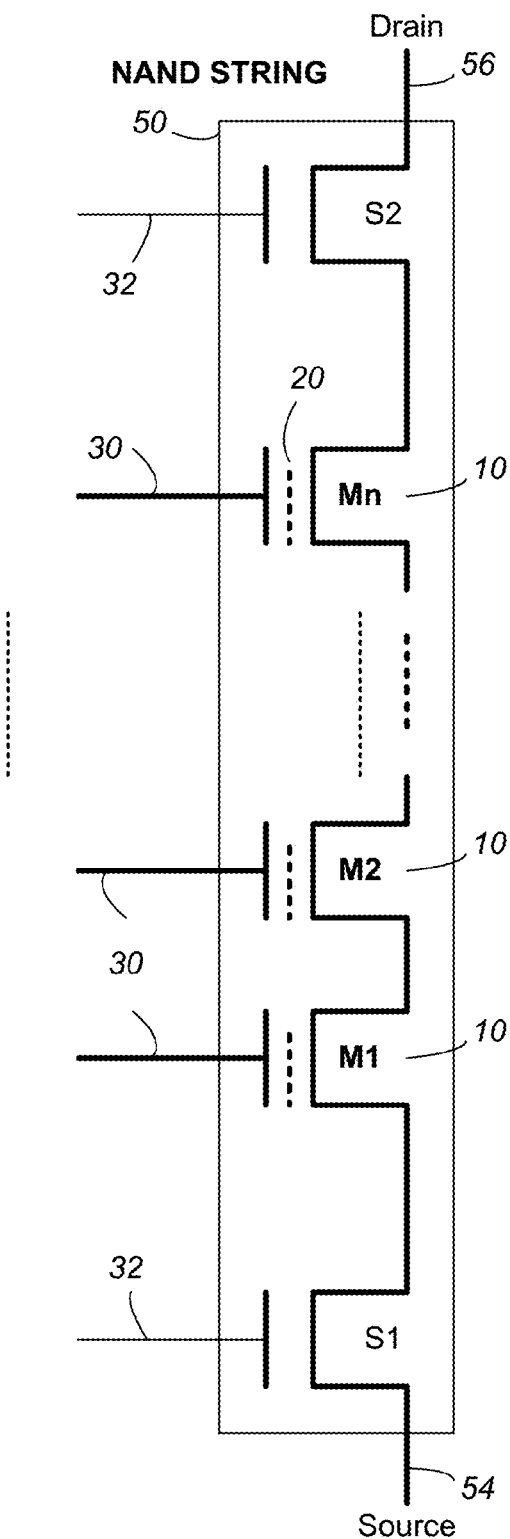
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively.

Figure 4B:
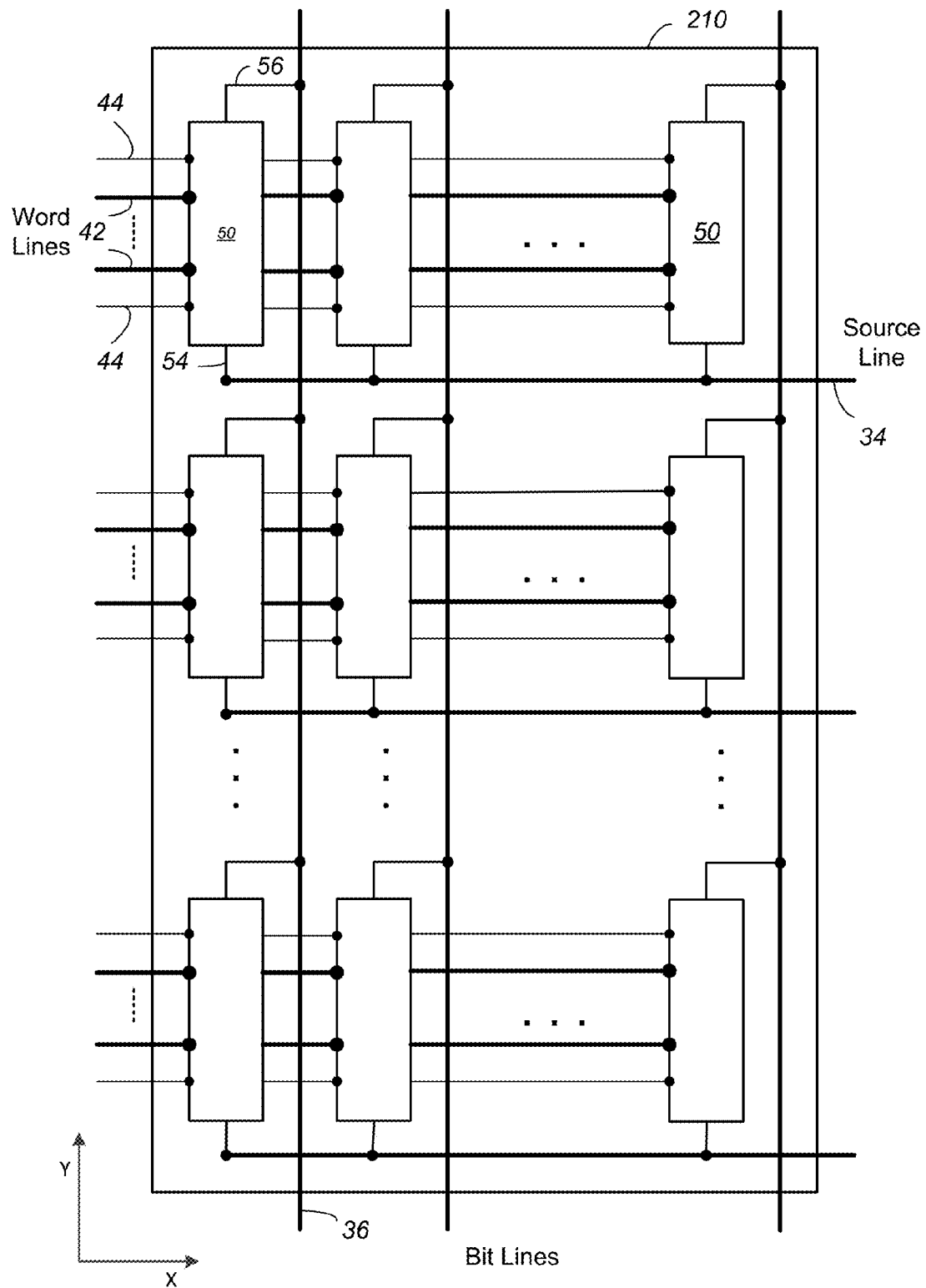
FIG. 4B illustrates an example of a NAND array 210 of memory cells, constituted from NAND strings 50 such as that shown in FIG. 4A.

In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
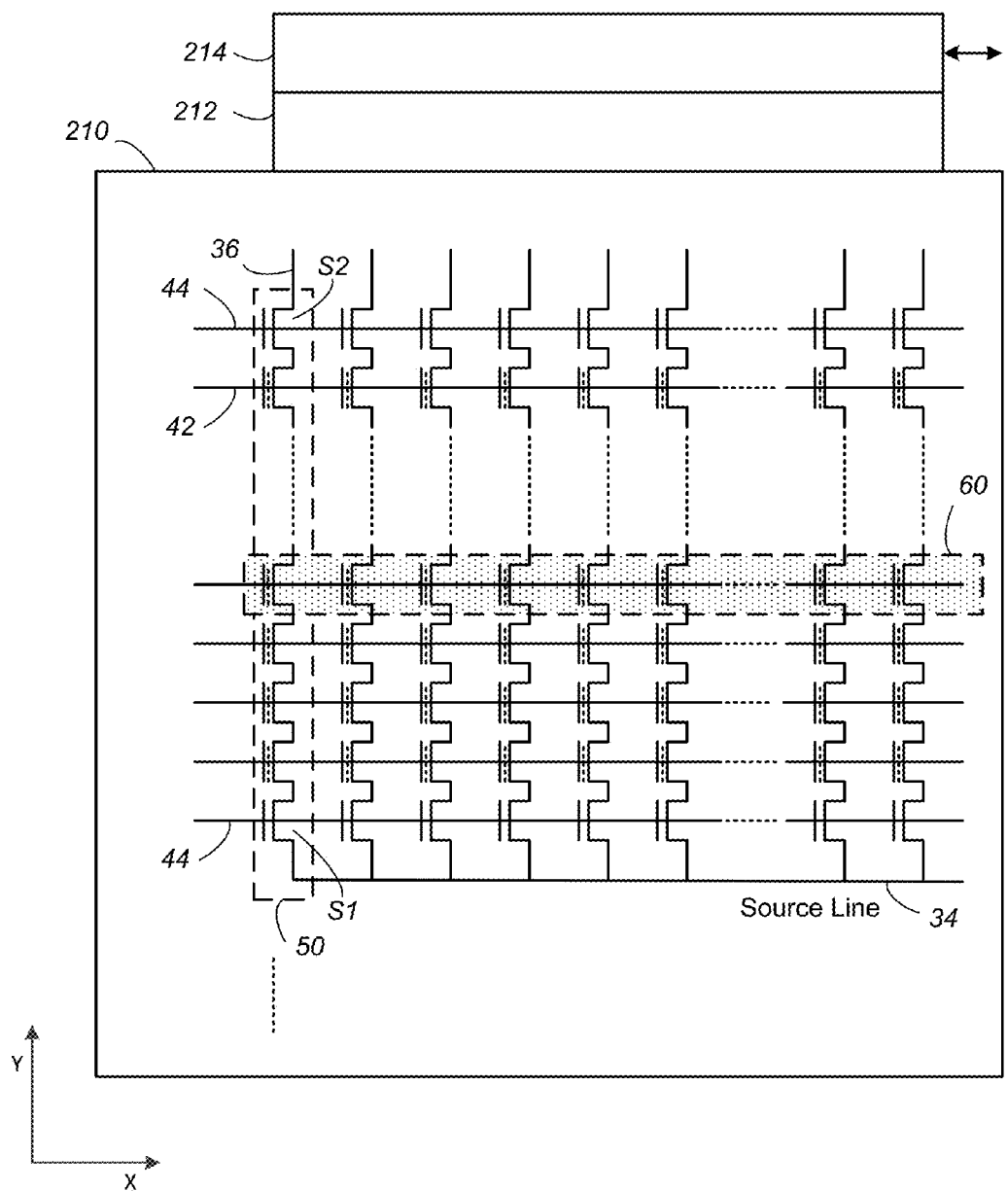
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
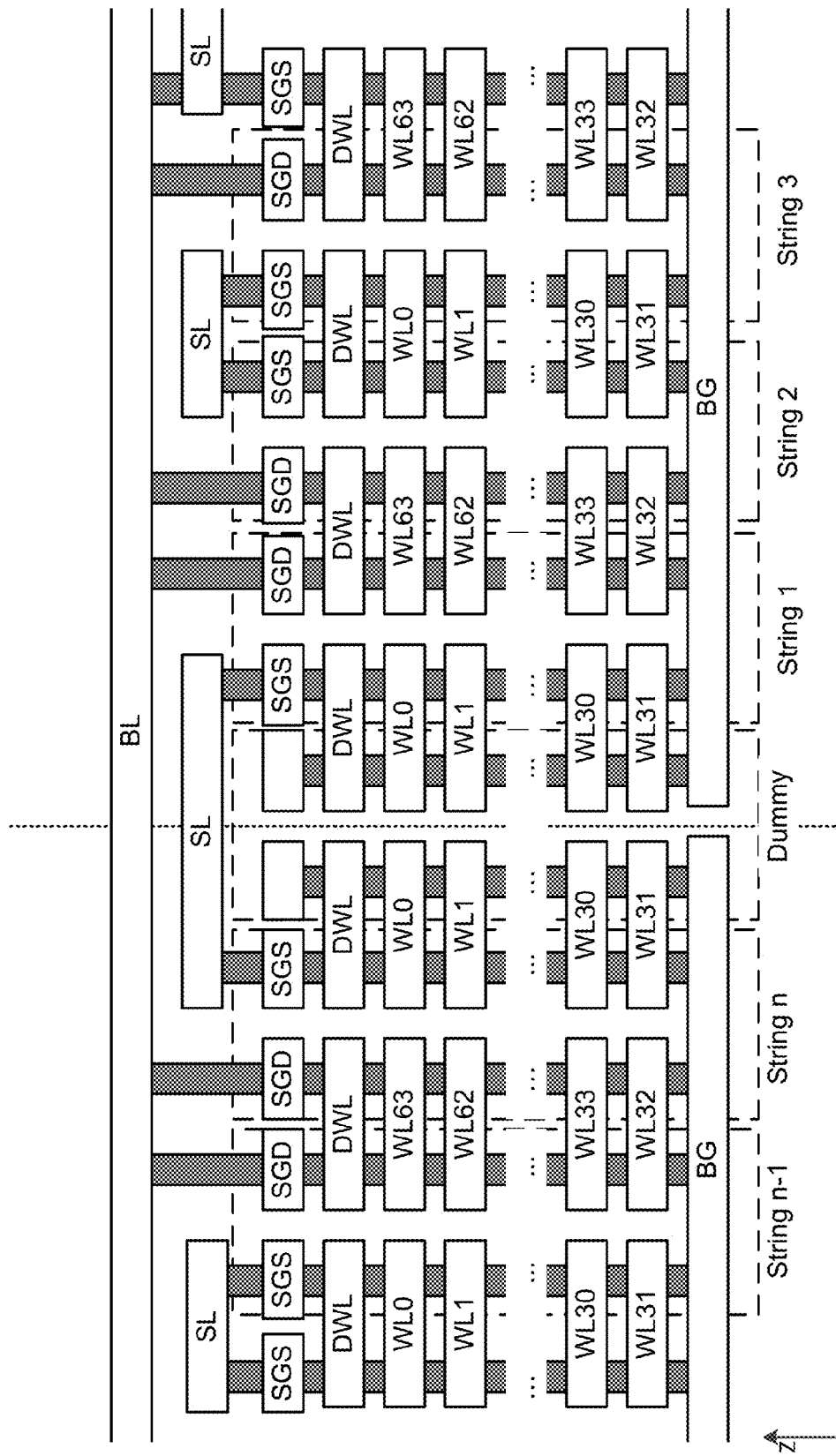
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
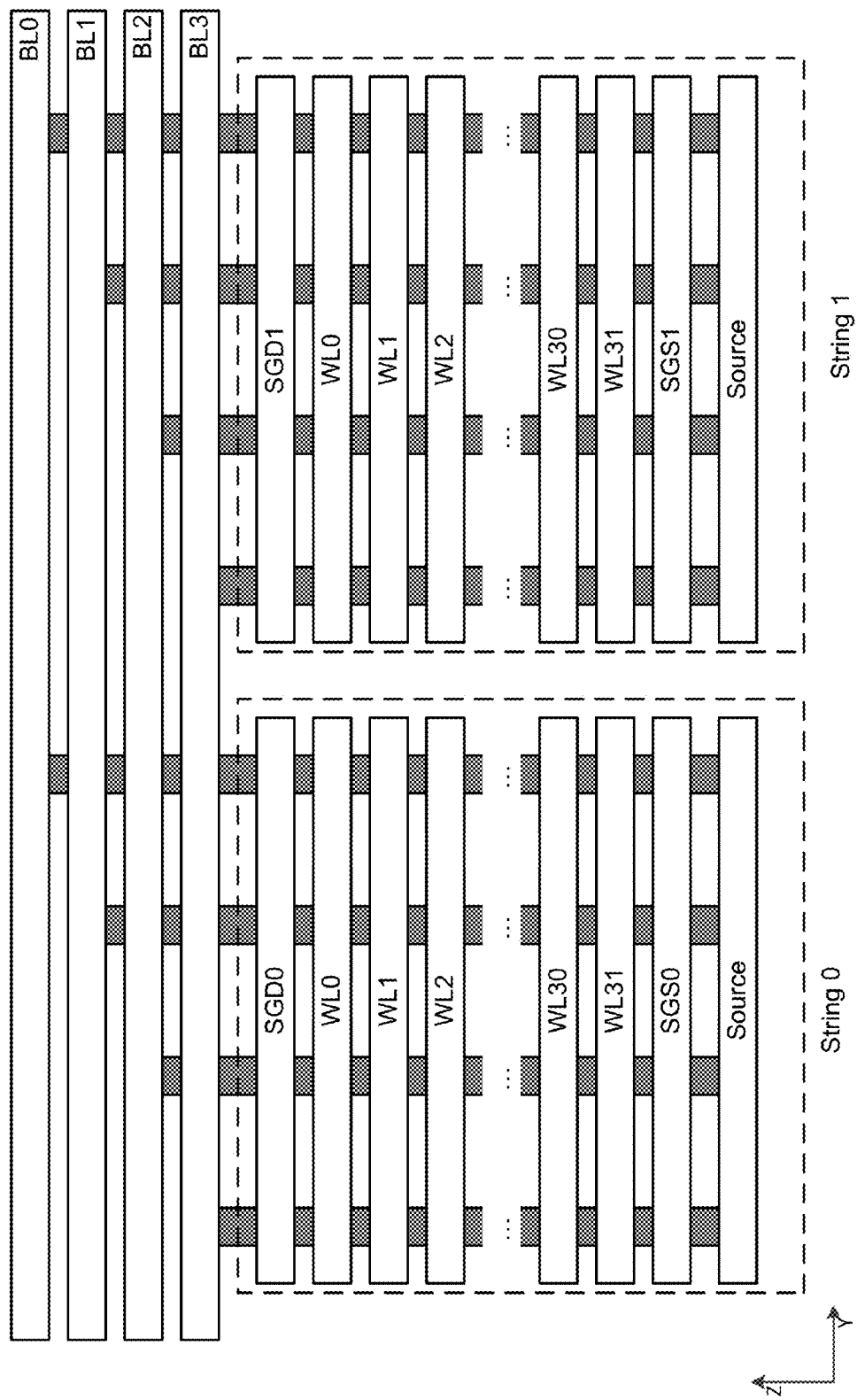
FIG. 10 shows an example of a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells.

Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of or behind the location of the cross-section of FIG. 10). Other three dimensional memories are based on resistive elements rather than charge storage elements.

Data Errors

When data is stored in a nonvolatile memory (e.g. 2D or 3D charge storage memory) for a period of time and then read out, some errors may occur in the data. Errors may occur for a variety of reasons including read disturb (i.e. the effects of reading the data and/or reading nearby data) or data retention issues (e.g. charge leaking from floating gates). The root causes of errors may be some physical defects in the memory structure resulting from the manufacturing process, some environmental effect, data pattern effect, or some combination of causes. In many cases, such errors may be corrected by Error Correction Code (ECC). However, if there are many errors in a portion of data then it may require significant time and resources to perform ECC correction. If the number of errors exceeds the limit of the ECC scheme then the data may be uncorrectable by ECC (UECC) and some other approach may be used to recover the data (e.g. high resolution read). However, such approaches generally require significant time and resources. If alternative approaches fail then data may be lost. Accordingly, it is generally desirable to avoid high error rates in stored data.

One common source of errors is the effect of voltages applied during read operations. When memory cells are read the read voltages applied may affect the charge in the memory cells thereby causing disturbance. When other memory cells in the same block are read, read pass voltages may be applied to unselected word lines in the block so that unselected cells that are not read may be disturbed. The degree of read disturbance may depend on a number of factors including the format of the data (e.g. MLC data may be more susceptible to read disturb than SLC), the read scheme used (read voltages and read pass voltages), memory cell geometry (smaller cells may be more susceptible), and other factors. Generally errors caused by read disturb increase in proportion to the number of read operations so that data which is frequently updated and rewritten may have a low risk for read disturb errors while data that is left unchanged for a long period and is frequently read may have a high risk for read disturb errors.

One factor that may affect how data is affected by read disturbs is the location of the data within a block. It has been found that data along some word lines in a block may suffer higher read disturb errors than data along other word lines in the same block. One example of a word line that may suffer from higher read disturb errors is word line that is at or near a boundary between written and unwritten word lines. Generally, programming data along word lines of a block (whether 2D or 3D) proceeds in a predetermined order (i.e. word lines are not programmed at random). Programming may proceed sequentially starting with WL0. A boundary word line has unwritten and/or partially written memory cells on one side. Such unwritten or partially written memory cells in a charge storage memory do not contain as much charge as written memory cells. The proximity of such unwritten cells produces different electrostatic forces on the charge in boundary word lines compared with other word lines so that such charge may tend to move more easily. The absence of charge on one side may also affect threshold voltages of memory cells along boundary word lines. Charge in close proximity to a cell's channel affects the cell's threshold voltage and this effect is not limited to charge stored in the particular cell. Charge in neighboring cells (or the absence of such charge) may also affect a particular cell's threshold voltage.

FIG. 11A shows an example of how a two bit per cell MLC memory may be programmed. The word line ("WL") number is indicated in the first column and entries in the second and third columns indicate the order of logical page programming lower page of ("LP") and upper page ("UP") data along each word line. Entries reflect the order of programming and correspond to logical page numbers of sequential data. In this example, upper page programming along a particular word line only proceeds after lower page programming of the neighboring word line has been performed. FIG. 11A shows programming of logical page 8 (shaded) along WL3, which occurs after programming of lower page data along WL4. At this stage, word line 3 may be considered as a boundary word line. While lower numbered word lines, WL0-WL2, are fully written, higher numbered word lines, WL4 and higher, are either partially written (WL4) or unwritten (WL5 and higher). Accordingly, electrostatic forces on electrons in memory cells along WL3 are different to electrostatic forces on memory cells along, for example, WL1. The effect of charge in neighboring cells on a particular programmed cell may be referred to as "Yupin effect." Memory cells along WL1 are sandwiched between fully programmed cells of WL0 and WL2 which both contain significant charge. In contrast, electrons along WL3 have fully programmed cells on only one side, along WL2, and partially programmed cells (with less charge) on the other side, along WL4. And beyond WL4 are memory cells with no charge or positive charge (erased state).

In some cases, data may be programmed as shown in FIG. 11A and stored for some time without programming additional data in the block so that WL3 remains a boundary word line for some extended period of time. In some cases, such data may be more susceptible to read disturbs than other data in the block (e.g. data stored along WL0, WL1, or WL2). In general, when data is stored as lower page only data (e.g. along WL4 where only lower page data is stored) there is a lower risk of read disturb so that while such a partially programmed word line may be considered a boundary word line the risk may not be as high as for MLC data along WL 3. Such lower page data may or may not be susceptible depending on various factors.

FIG. 11B illustrates programming of additional data. Logical page 9 is written as lower page data along WL5. After this data is written there are two partially written word lines (WL4 and WL5). WL3 may still be considered a boundary word line at this point.

FIG. 11C shows subsequent programming of upper page data (logical page 10) along WL4. Such upper page programming only takes place after lower page programming along the next word line, WL5. After logical page 10 is programmed, WL4 may be considered a boundary word line. WL3 is no longer a boundary word line at this point. Accordingly, the risk of read disturb errors may be lower along WL3 at this point than at the point illustrated in FIG. 11A. In some cases, WL 3 may no longer be susceptible to read disturb errors at this stage, while in other cases, two or more word lines such as WL 3 and WL 4 may be considered as susceptible because of their proximity to a boundary.

An alternative programming scheme is illustrated in FIGS. 12A-B. In this scheme, lower and upper page data are programmed together in what may be referred to as "full sequence programming." Each word line is fully programmed with lower and upper page data before programming proceeds to the next word line. Where there is insufficient data to program upper page data along a boundary word line, only lower page data may be programmed as shown in FIG. 12A. Thus, WL 3 may remain a boundary word line with a partially written word line (WL4) on one side. In other cases, the boundary word line is fully programmed and is immediately adjacent to an erased word line, e.g. WL4 of FIG. 12B is fully programmed with lower and upper page data and is immediately adjacent to WL5 which is unwritten. Such a boundary word line may be susceptible to read disturb errors. Word lines may be programmed in various orders and techniques described here are not limited to data programmed in any particular order.

FIG. 13A illustrates threshold voltage distributions for memory cells along a "normal" word line that has fully programmed word lines on either side. The threshold voltage distribution is similar to that shown in FIG. 6C. In contrast, FIG. 13B shows how threshold voltage distributions along a boundary word line may be different from other word lines. The programmed distributions (A, B, and C) along boundary word lines (shown by solid lines, with "normal" word line distributions shown by dashed lines) are lower than corresponding distributions for "normal" word lines because of the absence of charge in neighboring cells on one side. Thus, there is an offset between "normal" distributions and boundary word line distributions. This offset may be more pronounced for higher distributions (e.g. state C) leading to some overlap in distributions as shown (or some reduced margin between states in other examples).

Read disturbance may cause some charge to enter some memory cells (e.g. cells in the erased state) so that such cells undergo a change similar to light programming. Thus, the effects of read disturb tend to compound the problem of lower threshold voltages of cells in programmed states (A, B, and C) along boundary word lines shown in FIG. 13B by causing some overlap in distributions of different states.

FIG. 14A illustrates how read disturb may cause some overlap between the erased state and lowest programmed state (state A) especially along boundary word lines. The erased state distribution tends to move higher (shown by shaded area) as cells in the erased state gain charge while cells in the programmed states are already lower than normal because of the boundary word line location.

FIG. 14B illustrates how threshold voltages of memory cells along erased word lines may also be subject to read disturb. For example, such memory cells may be subject to a read pass voltage during reading of programmed word lines. The result is that the threshold voltage distribution moves up. This may cause some problems later when such memory cells are programmed. For example, when memory cells along such an unwritten word line are later programmed, some cells may already have threshold voltages that are higher than the range for erased cells. Such cells may tend to display fast programming behavior and as a result may be programmed to a state that is higher than their target state. Also, such a word line may appear to be programmed so that if the block is scanned to determine which word lines are written and which are unwritten, an unwritten word line along a boundary may appear written.

Each programmed word line may be considered a boundary word line at some point during programming. However, this condition may only exist for a short period for many word lines (e.g. during a sequential write, the next word line may be programmed immediately). However, in some cases, programming of a block may stop with some unwritten space (unwritten and/or partially written word lines) in the block. A certain number of blocks may be maintained as open blocks that are available for storage of user data. Such blocks may maintained in an open condition (rather than being compacted or combined with other data to fill blocks) for an extended period. A boundary word line in such a block may remain as a boundary word line for a significant period of time and for a significant number of read operations. While other word lines in such an open block may not have a high error rate from read disturbs, a boundary word line in such a block may have a high error rate if it is exposed to a large number of reads because it is especially susceptible to read disturbs.

Boundary word lines may be monitored to determine if there is a high risk of read disturb errors and some action may be taken when there is a high risk. For example, when programming of an open block stops at a new location and a new word line becomes the boundary word line, a read count may be initiated for the boundary word line. The number of read operations directed to the boundary word line may be counted. In some examples, the number of read operations directed to neighboring word lines may be counted (e.g. if read disturbance is caused by read-pass voltages). In some cases, these numbers may be combined (i.e. the number of reads of the boundary word line, and the number of reads of other word lines of the same block may be aggregated in some manner with each number weighted according to its read disturb effect on memory cells). In general, read disturb errors increase with the number of read operations so that below a threshold number of read operations the number of read disturb errors may be acceptable (e.g. correctable by ECC in an acceptable time). When the number of read operations indicated by the count reaches a point where read disturb errors are unacceptable, or about to become unacceptable, steps may be taken to ensure that the data along the boundary word line remains available without unacceptable delay.

Data that is at risk of significant read disturb errors may be copied to another location where further read disturbance is reduced or eliminated. For example, data along a boundary word line in an MLC block may be copied to an SLC block. In general, data stored in SLC format has larger margins between memory states so that such data is less susceptible to read disturb errors. The data may be subject to ECC correction when it is copied so that the new copy is substantially error-free when written and read disturb errors (or other errors) from the MLC copy are not brought over to the SLC copy. Furthermore, such data may be considered to be frequently read as indicated by the counter and SLC data is generally faster to read than MLC data so that relocating such frequently read data to SLC generally improves read performance.

Figure 15:
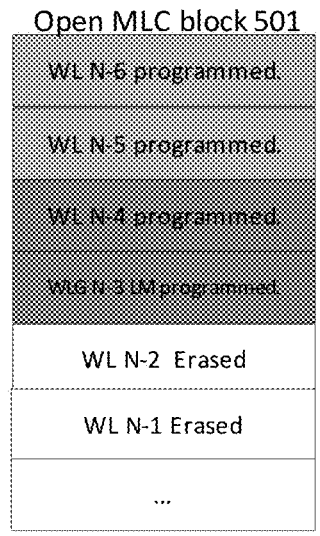
FIG. 15 illustrates word lines in proximity to a boundary between written and unwritten areas of an open block.

FIG. 15 shows an example of a portion of an open MLC block 501 including six word lines N-6 to N-1. Word lines N-6 and N-5 have fully written word lines on either side and therefore may not be particularly susceptible to read disturb errors. However, in some cases, WL N-5 may have some increased susceptibility because of its proximity to the boundary (i.e. it is adjacent to boundary word line WL N-4). WL N-4 is fully programmed with lower and upper page data and is particularly susceptible to read disturb errors. WL N-3 is programmed with lower page data only (no upper page data) so that it may be less susceptible to read disturb errors. WL N-2 and N-1 and subsequent word lines are erased so that there is no data along these word lines to be affected by read disturb errors at this stage (though there may be some change in the erased state threshold voltage distribution due to read operations, which can lead to problems during subsequent programming).

Figure 16:
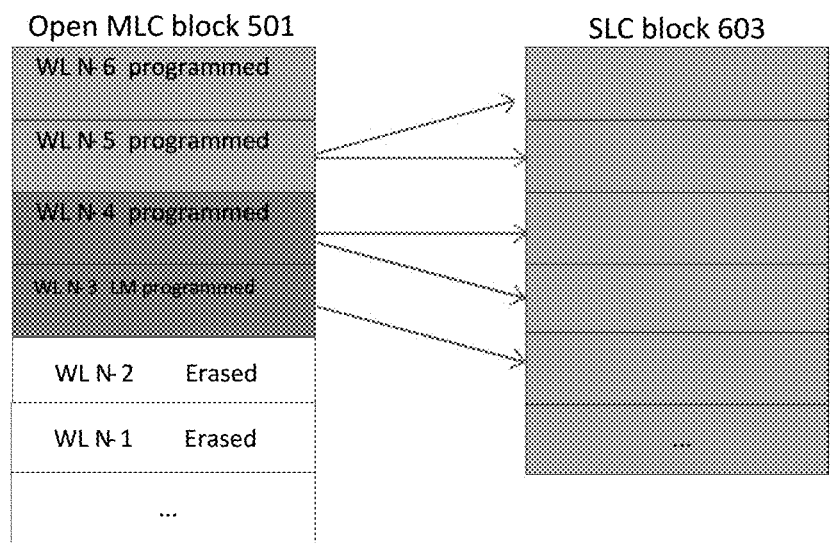
FIG. 16 illustrates copying of susceptible data to a location outside the block.

FIG. 16 shows how the data along word lines of open MLC block 501 may be copied to an SLC block 603. In this case, word lines N-5, N-4 and N-3 are considered to have increased risk of read disturbance so that they are copied to SLC block 603 (with word line N-4 having the highest risk because it contains MLC data adjacent to the boundary). Such copying may be triggered by a number of read operations (as monitored by a counter) exceeding a threshold number. In other cases, WL N-5 may not be copied (e.g. because its location above N-4 gives a sufficiently low risk of read disturb errors) and/or WL N-3 may not be copied (e.g. because it contains lower page data only, which gives it a sufficiently low risk of read disturb errors). In other examples, more data may be copied (e.g. WL N-6). In some cases, only one counter is maintained for an open block with a boundary word line. However, multiple counters may be maintained in some cases (e.g. one for boundary word line N-4, one for the next word line N-5, and one for partially written word line N-3) and different data may be copied in response to different counters reaching different thresholds. For example, WL N-4 may be more susceptible to read disturbs so that data along WL N-4 is copied when a read counter for WL N-4 reaches a first threshold. WL N-5 may be less susceptible to read disturbs so that data along WL N-5 is copied when a read counter for WL N-5 reaches a second threshold that is greater than the first threshold.

After data is copied to a location outside the open MLC block 501 subsequent read operations may be directed to the copy in SLC block 603 and not to the data near the boundary in the open MLC block 501. This stops further read disturb errors and improves read time for the copied data. A record, such as a table or other suitable form of record, may be maintained to track which data is copied and where the new copy is located. This allows the copy to be read and the data to be returned when the data is subsequently accessed.

FIG. 17 shows an example of a table that may be maintained to redirect read access from a source block such as open MLC block 501 to a destination block such as SLC block 603 after copying. The logical address of the copied data is maintained in one column with the physical address of the word line in the source block in a second column and the physical address of the SLC copy in a fourth column. A flag is also maintained to indicate whether the SLC copy is valid. If the source block is compacted or copied then the SLC copy may be combined with the source data and the SLC copy may become obsolete. For example, additional data may be written to the open MLC block causing the block to be closed, at which point valid data in the block may be copied to a new MLC block where it is written with the data copied to SLC. The SLC copy then becomes obsolete. When a read request is received, such a table may be checked to see if any logical address requested corresponds to copied data. If one of the logical addresses to be read is found in the table then it is read from the SLC address in the table (if the SLC copy is valid). This avoids subsequent reading of copied data from an open MLC block. Such a table may be compacted from time to time by copying valid rows only to a new location (discarding any obsolete rows). The table may be kept in a dedicated block. When such a block is full the valid data may be copied to another block.

Figure 18:
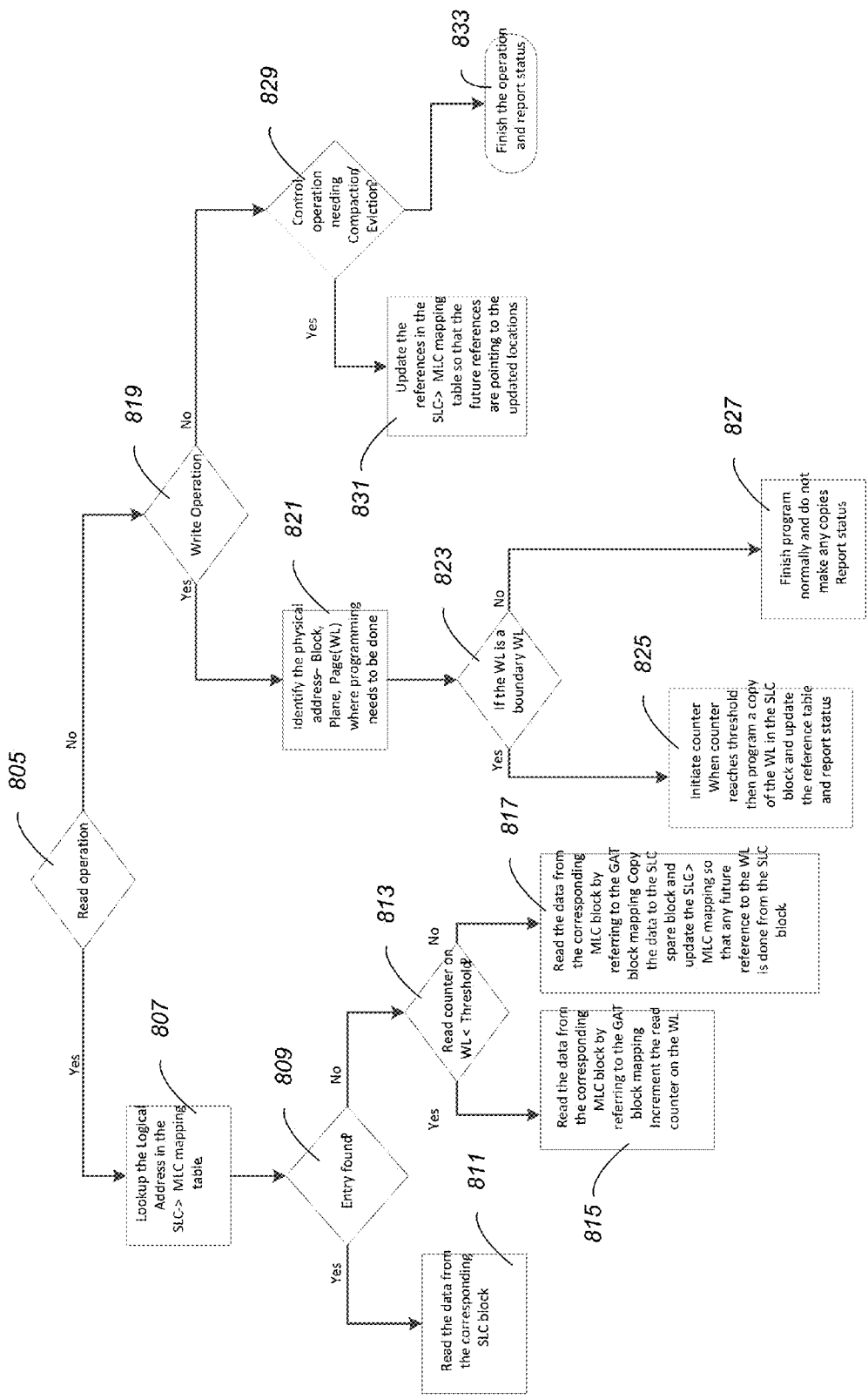
FIG. 18 illustrates an example of management of a memory system with copying of data that is susceptible to read disturb errors.

FIG. 18 illustrates an example of how a memory system may be managed. When an operation is to be performed, a determination is made as to whether it is a read operation 805. If it is a read operation then logical addresses of data to be read are checked against logical addresses in a table 807 to see if they the data is in SLC (i.e. if there are valid entries with the same logical addresses). If the data is in SLC 809 then the data is read from the corresponding SLC block 811 (not from the original MLC block). If no such entry is found and the data is in cells of a word line near a boundary of an open block then a determination is made as to whether the read counter for the boundary word line of the block is less than the threshold number of reads 813. If the counter is less than the threshold number then the data is read from the word line near the boundary of the corresponding MLC block and the counter is incremented by one 815. If the counter indicates a number of reads that is not less than the threshold then the data is copied from the MLC block to an SLC block and the mapping table is updated to ensure that subsequent reads are directed to the SLC block 817. If a write operation is to be performed 819 then the physical location where data is to be written is identified 821 (i.e. block, plane, and page or WL). A determination is then made as to whether the write operation results in a boundary word line 823 (i.e. whether a block is filled, or only partially filled). If a boundary word line is written then a counter is initiated for the boundary word line 825 and when the counter reaches the threshold the data is copied to SLC and a reference table is updated. If no boundary word line is written (e.g. block is filled) then writing proceeds normally, without copying data. If a counter was already maintained for the block (i.e. if the block was previously opened and had a boundary word line) then the counter may be reset to zero for the new boundary word line. If the operation is not a read or write operation then a determination is made as to whether it is a control operation that includes compaction or eviction 829 (i.e. whether data in an open MLC block is being copied to another block). If the operation includes compaction or eviction then the table may be updated so that any SLC entries are marked as obsolete and subsequent read requests are directed to the new MLC block 831. If the operation does not include compaction/eviction then the operation is performed as usual 833.

In addition to data along boundary word lines of open blocks, some other data may be considered to be susceptible to read disturb errors and may be copied to another location. For example, a word line at a physical edge of a block may be subject to a higher risk of read disturb errors because of its physical location, with no charge on one side of it (regardless of subsequent programming). This may include a word line at one edge of a block in a planar memory (e.g. planar NAND) or at one edge of a block in 3-D memory (e.g. in top or bottom physical level of a block in 3-D NAND or other 3-D memory). Accordingly, data in such a location may be subject to special treatment to protect it from read disturb errors.

According to an example, data in along a word line at a physical edge of a block may be copied to a location outside the block. For example, data along an edge word line in an MLC block may be copied to a location in an SLC block. In some cases, a counter may be maintained and the data may be copied only after the counter reaches a threshold number of read operations. In other cases, no such counter may be maintained and the data may be copied from MLC to SLC immediately.

Figure 19:
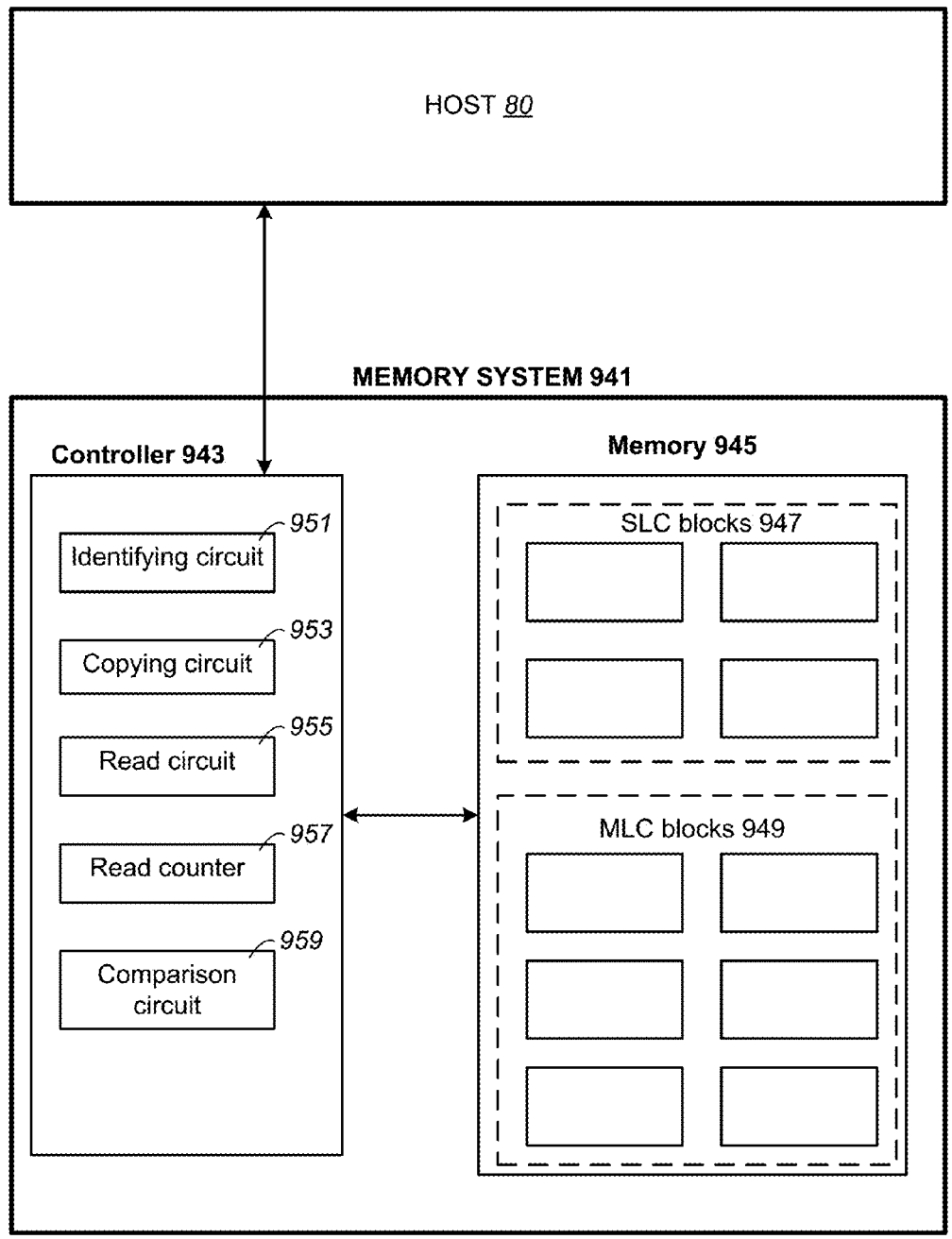
FIG. 19 illustrates an example of hardware of a memory system.

FIG. 19 shows an example of a memory system 941 that includes a controller 943 and a memory 945. Memory 945 may be a planar (2D) memory or 3D memory and may be a charge storage memory (or other type of memory) such as a NAND flash memory. Memory 945 includes SLC blocks 947 and MLC blocks 949 some of which may be maintained as open blocks with some word lines written and other word lines unwritten. Controller 943 includes an identifying circuit 951 that is configured to identify one or more word lines in a given open MLC block that may be at high risk of read disturb errors (e.g. because of its proximity to a boundary or its location at the physical edge of a block). Copying circuit 953 is configured to copy data from identified word lines to another location (e.g. to a location in SLC blocks 947). Read circuit 955 is configured to subsequently read the data from the other location (not from the open MLC block). A read counter 957 counts the number of read requests for data of a boundary word line in the MLC block. A comparison circuit 959 compares the count from read counter 957 with a threshold number to determine if data should be copied. While these circuits are shown located in controller 943, they may be at any suitable locations and may be implemented in any suitable manner (e.g. as dedicated circuits in an Application Specific Integrated Circuit or "ASIC," in programmable logic, or through circuits that are at least partially configured by firmware).

CONCLUSION

The foregoing detailed description has been presented for purposes of illustration and description. It is not intended to be exhaustive or to limit the attached claims. Many modifications and variations are possible in light of the above teaching.

It is claimed:

1. A nonvolatile memory system comprising:
a plurality of Multi Level Cell (MLC) blocks that store more than one bit per cell;
an identifying circuit that is configured to identify one or more high risk word lines in an individual MLC block that contains data that is at high risk of read disturb errors;
a copying circuit that is configured to selectively copy the data from the one or more high risk word lines to a location outside the individual MLC block; and
a read circuit that is configured to read the data from the location outside the individual MLC block.

2. The nonvolatile memory system of claim 1 further comprising a plurality of Single Level Cell (SLC) blocks that store only one bit per cell, and wherein the location is in an SLC block.

3. The nonvolatile memory system of claim 1 wherein the identifying circuit is configured to identify a boundary between written and unwritten word lines.

4. The nonvolatile memory system of claim 3 further comprising a read count circuit that counts the number of read operations performed on an individual written word line adjacent to the boundary between written and unwritten word lines.

5. The nonvolatile memory system of claim 4 further comprising a comparison circuit in communication with the read count circuit, the comparison circuit configured to compare the number of read operations performed with a threshold number and to designate the individual written word line as a high risk word line if the number of read operations performed exceeds the threshold number.

6. The nonvolatile memory system of claim 1 wherein the identifying circuit is configured to identify the one or more high risk word lines from their physical location at an end of the block.

7. The nonvolatile memory system of claim 6 wherein the MLC blocks are formed in a three dimensional memory that is monolithically formed in one or more physical levels of arrays of memory cells having an active area disposed above a silicon substrate, the one or more high risk word lines located in a highest or lowest physical level.

8. A method of operating a nonvolatile memory comprising:
identifying one or more high risk word lines in a Multi Level Cell (MLC) block that contain data that is at high risk of read disturb errors;
selectively copying the data from the one or more high risk word lines to a location outside the MLC block;
maintaining a copy of the data outside the MLC block; and
subsequently directing read requests for the data to the copy of the data outside the MLC block.

9. The method of claim 8 wherein the location outside the MLC block is in a Single Level Cell (SLC) block.

10. The method of claim 8 wherein the identifying one or more high risk word lines is based on proximity to a boundary between written and unwritten word lines.

11. The method of claim 10 wherein the identifying one or more high risk word lines is further based on counting a number of read operations performed on an individual written word line in close proximity to the boundary.

12. The method of claim 11 wherein the individual word line is identified as a high risk word line in response to determining that the number of read operations directed to the individual written word line exceeds a threshold number.

13. The method of claim 8 wherein the identifying one or more high risk word lines is based on physical locations of word lines within a block.

14. The method of claim 13 wherein a word line located at a physical edge of the MLC block is identified as a high risk word line.

15. The method of claim 14 wherein the MLC block is written in a predetermined word line order and the word line at the physical end is the last written word line in the predetermined word line order.

16. The method of claim 14 wherein the nonvolatile memory is a three-dimensional nonvolatile memory that is monolithically formed in one or more physical levels of arrays of memory cells having an active area disposed above a silicon substrate and wherein the one or more high risk word lines are in a highest or lowest physical level.

17. A method of operating a nonvolatile memory comprising:
writing Multi Level Cell (MLC) data in an MLC block in a plurality of word lines of a block, leaving additional word lines unwritten;
subsequently maintaining a count of read operations performed on a last fully written word line of the block;
comparing the count with a threshold number;
in response to determining that the count exceeds the threshold number, copying the data from the last fully written word line to a Single Level Cell (SLC) block;
maintaining a copy of the data in the SLC block; and
subsequently directing read requests for the data to the copy of the data in the SLC block.

18. The method of claim 17 wherein a partially written word line with only lower page data is located between the last fully written word line and the additional word lines that are unwritten.

19. The method of claim 17 wherein the nonvolatile memory is a three dimensional nonvolatile memory that is monolithically formed in one or more physical levels of arrays of memory cells having an active area disposed above a silicon substrate.

20. The method of claim 17 wherein the memory system maintains a number of open MLC blocks that are open for writing new data and wherein individual counts are maintained of read operations performed on last fully written word lines of each open MLC block.

21. The method of claim 17 further comprising;
subsequently copying the MLC data from the MLC block to another MLC block and designating the copy of the data in the SLC block as obsolete.

22. The method of claim 21 further comprising, prior to copying the MLC data from the MLC block to another block, writing additional MLC data in the MLC block.

23. The method of claim 22 wherein the writing of the additional MLC data in the MLC block substantially fills the MLC block.

* * * * *